United States Patent [19]
Clarke et al.

[11] Patent Number: 5,136,300
[45] Date of Patent: Aug. 4, 1992

[54] MODULAR SOLID STATE RADAR TRANSMITTER

[75] Inventors: John Clarke, Baltimore; Joseph A. Faulkner, Jr., Ellicott City; Gregory K. Sinon, Dayton; Brian J. Misek, Pasadena; John E. Kositz, Glen Burnie, all of Md.

[73] Assignee: Westinghouse Electric Corp., Pittsburgh, Pa.

[21] Appl. No.: 713,259

[22] Filed: Jun. 13, 1991

[51] Int. Cl.$^5$ ............................................. G01S 7/282
[52] U.S. Cl. .................................................... 342/175
[58] Field of Search ........................................ 342/175

[56] References Cited

U.S. PATENT DOCUMENTS

4,336,538 6/1982 Radford ............................... 342/175
4,951,060 8/1990 Cohn .................................... 342/175

Primary Examiner—T. H. Tubbesing
Attorney, Agent, or Firm—W. G. Sutcliff

[57] ABSTRACT

A solid state radar transmitter for use in airborne applications has a modular design which extends into the transmitter. The transmitter is formed of a plurality of power modules the number of which is selected based on the power required for a particular application. For example, two 75 to 100 watt modules may be used for weather radar, while 30 to 60 or more modules may be used for fire control in a military fighter. A radio frequency signal from a stabilized local oscillator is distributed by a splitter to the power modules and a combiner is used to combine the output from the power modules to produce the transmitter output signal. Each power module is formed of parallel connected power amplifiers, preferably formed by GaAs FETs and a power conditioning and control unit. The power conditioning and control unit produces a DC bias across the FETs as desired to produce a particular signal. The transmitter output signals which can be produced in this manner include rectangular, Gaussian on a pedestal and one amplifier at a time for testing purposes.

23 Claims, 7 Drawing Sheets

MODULAR SOLID STATE RADAR TRANSMITTER

CROSS-REFERENCE TO RELATED APPLICATIONS

This application is related to the following U.S. patent applications filed on the same date and assigned to the same assignee: VIBRATION INSENSITIVE QUARTZ CRYSTAL OSCILLATOR, Ser. No. 07/713,260 by Michael M. Driscoll and Norman G. Matthews and WINDSHEAR RADAR SYSTEM WITH UPPER AND LOWER ELEVATION RADAR SCANS, Ser. No. 07/714,133 by Bruce D. Matthews, Paul D. Montcastle and Walter G. Patterson, both incorporated herein by reference.

BACKGROUND OF THE INVENTION

2. Field of the Invention

The present invention is directed to a radar system for stationary or mobile use and, more particularly, to an airborne radar transmitter constructed of solid state devices for producing pulsed radar signals.

2. Description of the Related Art

Conventionally, airborne radar systems are a single integral unit with travelling wave tube amplifiers for high power, high frequency applications. Such units have to be substantially redesigned for each change in application. Providing for graceful degradation by providing multiple components to avoid a single point failure is expensive. Similarly, repair of the unit typically requires removal of the entire electronic assembly for shop repair.

In other applications, solid state devices are sometimes used in a radar transmitter. Low power applications with relatively low coherency requirements can use IMPATT diodes. Low frequency (and usually low power) applications can use silicon bipolar transistors. For example, a Westinghouse SPS-40 requires about 4 m$^3$ (135 cu. ft.) for a transmitter producing 300 KW peak and 5 KW average and thus is practically limited to shipboard use in mobile applications. However, improvements in the reliability and ease of maintenance of high power, high frequency radar transmitters are desired.

SUMMARY OF THE INVENTION

An object of the present invention is to provide a radar system that can be easily modified for different applications.

Another object of the present invention is to provide a radar system capable of graceful degradation.

A further object of the present invention is to provide a radar system that can be easily repaired on the flight line.

Yet another object of the present invention is to provide a radar system using solid state devices in the transmitter for improved reliability.

The above objects are attained by providing a radar system, comprising system control means for controlling operation of the radar system; radio frequency means for producing a radio frequency signal; a plurality of power modules, each having a plurality of high frequency transistors connected in parallel, for amplifying the radio frequency signal to produce amplifier signals; means for connecting the power modules in parallel to produce a transmitter output signal; amplifier control means for individually controlling the solid state power amplifiers; and receiver means for receiving a return signal and supplying the return signal to the system control means for processing. Preferably, the power modules, parallel connection means and amplifier control means form a separate transmitter unit and the receiver is a separate unit. The system control means may be one or more modules including digital and general signal processors and a synchronizer for the system. Other units include a stabilized local oscillator and a regulated power supply.

In the preferred embodiment, each of the power modules in the transmitter includes a power control unit to control operation of the power module using control signals; the power amplifiers, each amplifying the radio frequency signal into an amplified signal in dependence upon the control signals; a power splitter to distribute the radio frequency signal to the power amplifiers; and a power combiner to combine the amplified signal from each of the transistors to form a module output signal. The parallel connection means includes a module splitter for distributing the radio frequency signal from the stabilized local oscillator to each of the power modules and a module combiner for combining the module output signal from each of the power modules to produce the transmitter output signal.

The power control unit in each of the power modules is preferably capable of operating in different modes. In a power mode, the amplified signals are aligned in phase so that they can be combined to produce the transmitter output signal with high power. The shape of the transmitter output signal's waveform may be modifiable to form a waveform of any shape, including a Gaussian waveform or other pseudosinusoidal waveform or even an asymmetrical or coded pulse. In another mode, the power control unit in each of the power modules is controlled by the system control means so that the transmitter output signal at any given time is produced by one or a small number of transistors in the entire system or at least within each module. The transistor(s) used in this mode are changed in a predetermined sequence to test all of the transistors.

These objects, together with other objects and advantages which will be subsequently apparent, reside in the details of construction and operation as more fully hereinafter describe and claimed, reference being had to the accompanying drawings forming a part hereof, wherein like reference numerals refer to like parts throughout.

DESCRIPTION OF THE PREFERRED EMBODIMENT

Figure 1:
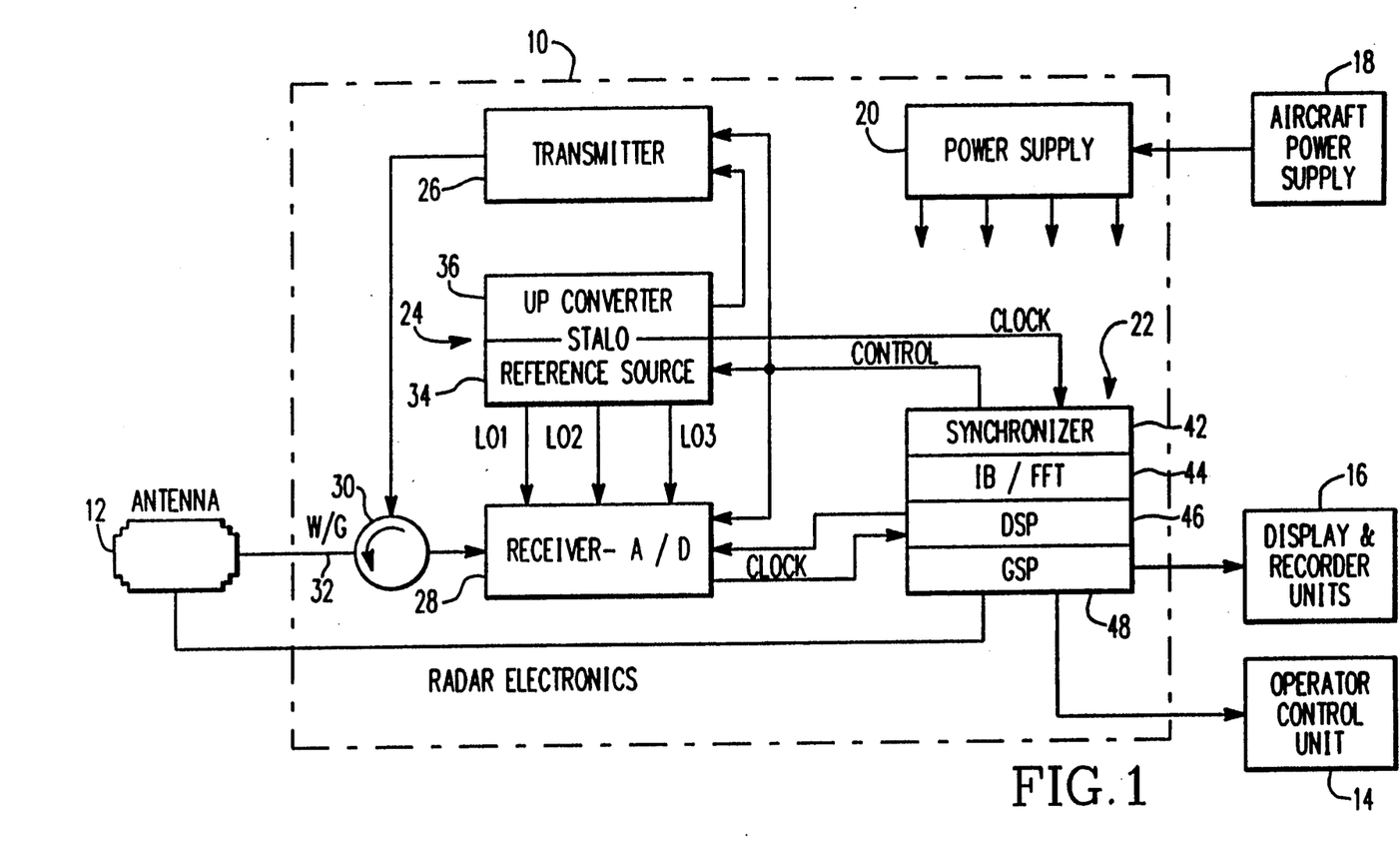
FIG. 1 is a block diagram of a radar system according to the present invention.

The basic components of a radar system according to the present invention are illustrated as a block diagram in FIG. 1. The basic functions of any modern radar system are provided. In the preferred embodiment, the majority of the radar electronics 10 are located in a single ATR chassis with the standard dimensions 7.64×10.09×26.24 inches (approximately 20×25×65 cm) established by the Federal Aviation Authority (FAA). The present invention is designed to be modular, permitting increased functions to be performed by adding additional units and depending upon the application a different size chassis may be used. Since the receiver, transmitter and processor are all included in the chassis 10, the chassis 10 will be referred to as an R-T-P chassis. An antenna unit 12, including the antenna itself, motors and motor control electronics, is typically physically separated from the R-T-P chassis 10.

The R-T-P chassis 10 is preferably located in a service bay in the lower portion of the aircraft so that it can be easily serviced while on the flight line. Other devices to which the R-T-P chassis 10 is connected may be located elsewhere in the aircraft. An operator control unit 14 is located in the cockpit. Display and recorder units 16 include at least one display also located in the cockpit. An aircraft power supply 18 provides electrical power of, e.g., 115 volts and 400 hertz.

The components of the radar system in the R-T-P chassis 10 illustrated in FIG. 1 include a regulating power supply 20 connected to the aircraft power supply 18. The power supply 20 provides electrical power of several voltages as needed by the various other devices in the R-T-P chassis 10, as indicated by the downward pointing arrows. Also connected to all of the other devices in the R-T-P chassis 10 as well as the display and recorder units 16 and operator control unit 14 is a system control unit 22.

A stabilized local oscillator or STALO 24 is likewise connected to the electronic components in the R-T-P chassis 10. The STALO 24 may be a conventional unit, but preferably uses an oscillator as disclosed in the application LOW VIBRATION SENSITIVITY CRYSTAL OSCILLATOR ARRANGEMENT by Driscoll et al., to provide a radio frequency signal to a transmitter 26 which amplifies the signal and outputs it to the antenna unit 12. Reference frequency signals are supplied by the STALO 24 to a receiver 28. A coupler 30, such as a coaxial duplexer model T9XQ1 from Sonoma Scientific of Forestville, Calif., and waveguide 32 connect the transmitter 26 and receiver 28 to the antenna unit 12.

As indicated in FIG. 1, the STALO 24 includes a reference source 34 connected to the receiver 28 and an up converter 36 connected to the reference source 34 and the transmitter 26. The reference source 34 in addition to supplying radio frequency signals to the transmitter and receiver also generates a clock signal for the system control unit 22.

The regulated power supply 20 preferably is an integral switching power supply with high efficiency and low noise. Depending upon the application, instead of a single power supply 20 for the radar system, the functions performed by the power supply 20 may be distributed in a variety of locations within the R-T-P chassis 10. One power supply 20 may provide power at general purpose voltage(s) using redundant units (if desired) in one location, while additional power supply units located within the other components, such as the transmitter 26, receiver 28, and even the processor 22 and STALO 24, provide power at the specific levels of voltage and current required by those components.

The receiver 28 may be a conventional receiver including an analog/digital converter. In the preferred embodiment, the radar system uses pulsed radar, thereby permitting the receiver 28 to receive echo signals when the transmitter 26 is not generating an output signal.

The system control unit 22 includes a number of modules which are illustrated in FIG. 1. A synchronizer module 42 provides synchronization signals for all of the electronic components based upon the clock signal received from the STALO 24. A fast fourier transform processor (IB/FFT) 44 includes an input buffer into which the output from the receiver 28 is stored and a fast fourier transform processor, such as a TRW 2310 FFT from the LSI division TRW in La Jolla, Calif. The output from the IB/FFT 42 is supplied to a digital signal processor module (DSP) 46 which includes at least one digital signal processor chip, such as a TMS320C30GBL (hereafter C30) from Texas Instruments of Dallas, Tex. A general signal processor module 48 includes at least one general purpose processor, such as a Texas Instruments 34020 graphics processor.

Additional processor chips are added to the modules as the number and complexity of applications performed by the radar system increase. For example, in a weather radar including the capability to detect windshear conditions as disclosed in the U.S. patent application Ser. No. 07/713,133 entitled WINDSHEAR RADAR SYSTEM WITH UPPER AND LOWER LEVEL SCANS by Matthews et al., a single 34020 chip may be sufficient in the general signal processor module 48 with a pair of C30 chips in the digital signal processor module 46. If the radar system is to also perform navigational applications, additional processors can be added in a parallel processor system.

Figure 2:
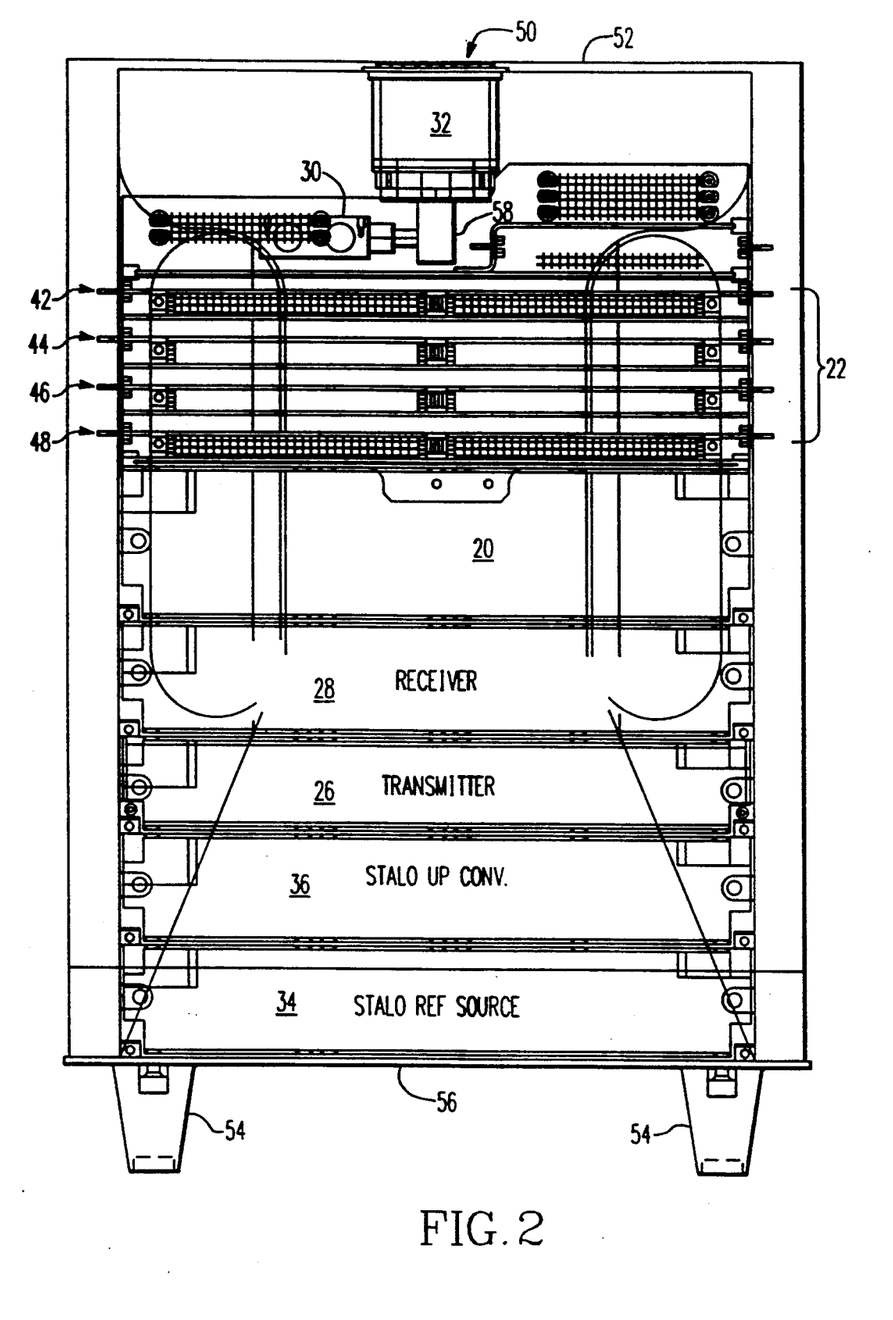
FIG. 2 is a top view of modules in a one ATR chassis.

An example of the physical construction of a one ATR R-T-P chassis 10 for a weather radar system is illustrated in FIG. 2. The power supply 20 is generally centrally located to simplify power distribution. A blind mate waveguide and ARINC 708 standard (BKAD2-163-4903) connector 50 as defined by the Federal Aviation Authority is provided on an inner wall 52 and handles 54 are provided on an outer wall 56. A waveguide to coaxial converter 58 is provided between the waveguide 32 and coaxial duplexer 30. The processor unit 22 including modules 42, 44, 46, 48 are located near the inner wall 52 to minimize the wiring between the blindmate connector 50 and the processing unit 22. The receiver 28 and transmitter 26 are located reasonably close to the inner wall 52 to minimize the length of the coaxial connection and loss of signal strength, while the STALO 24 is located near the outer wall 56.

Figure 3:
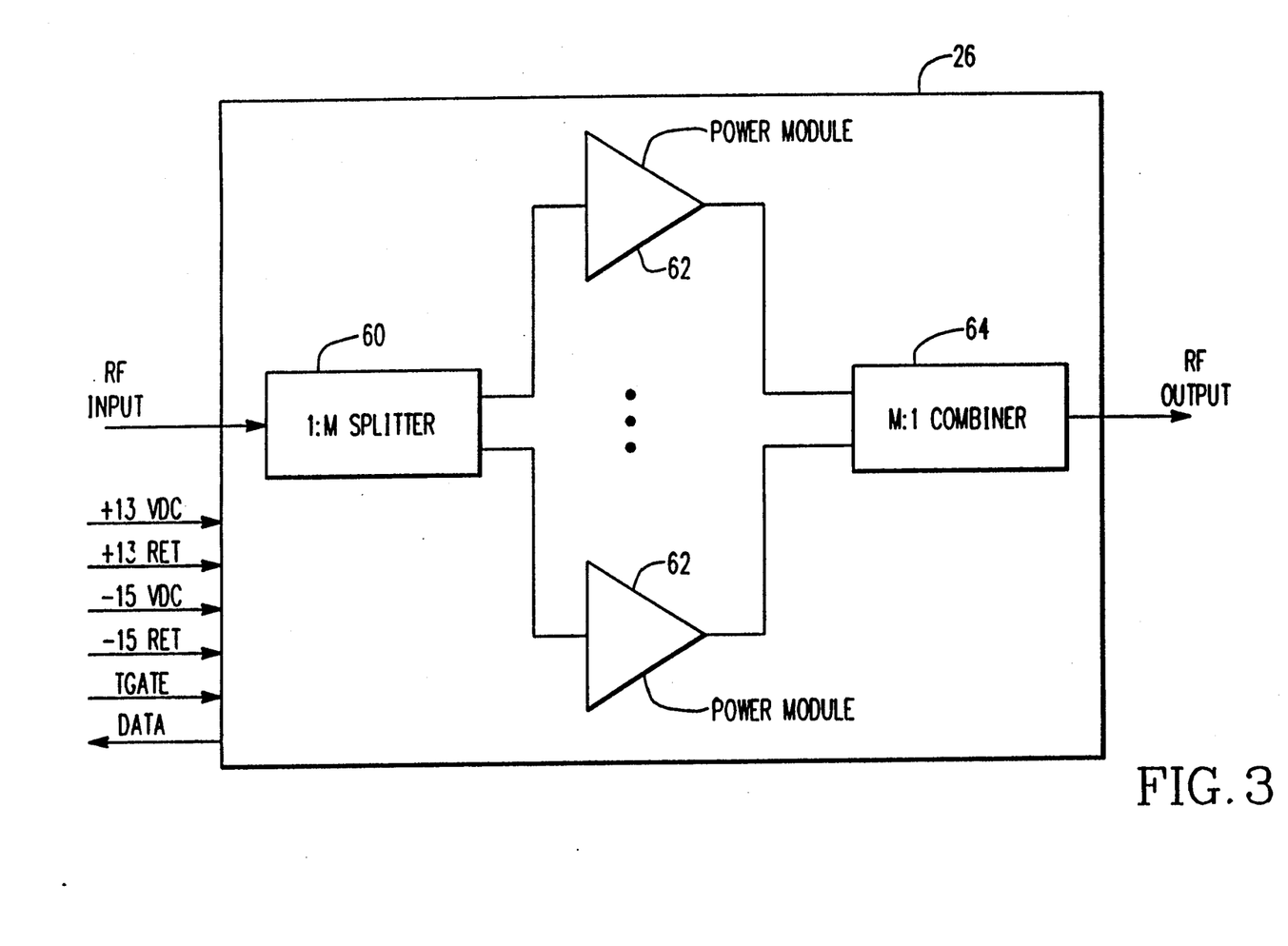
FIG. 3 is a block diagram of a solid state radar transmitter according to the present invention.

The modular construction of a radar system according to the present invention is carried into the transmitter 26 on multiple levels. The highest level diagram of a radar transmitter according to the present invention is provided in FIG. 3. The radio frequency signal from the up converter 36 in the STALO 24 is received by a module splitter 60. The splitter 60 distributes the radio frequency signal to power modules 62. Assuming there are M power modules 62, the splitter 60 is a 1:M splitter as illustrated in FIG. 3.

To produce the transmitter output signal, an M:1 module combiner 64 receives the output signals from the power modules 62 and combines them. The splitter 60 and combiner 64 may be made in striplines or microstrips using corporate or serial configurations or a combination of the two configurations, depending on the number M of power modules 62. Stripline splitters and combiners provide the benefit of vertical shielding permitting vertical integration, while microstrip splitters and combiners can be manufactured at lower cost. Therefore, if power requirements are high and space requirements tight, such as in a military fighter, stripline technology is preferred, while in a low power commercial weather radar system, microstrip technology is more cost effective.

As noted above, the number of power modules 62 in a transmitter according to the present invention depends upon the amount of power required for the application or applications supported by the radar system. The power modules 62 are preferably constructed from solid state devices as described below in more detail. These devices can be conveniently packaged in modules producing 75 to near 100 watts. Thus, a low power weather radar system requiring a transmitter producing a signal of between 150 to 200 watts may have only two power modules 62. On the other hand, a fire control radar in a military fighter may need a transmitter generating 2,000 to 3,000 watts which may be constructed from 30 or more of such modules and if excess capacity or redundancy is desired, over 60 such modules.

The power modules 62 may be physically connected to the module splitter 60 and module combiner 64 using any known method which permits removing the modules 62 while securely withstanding vibration during flight. A two module system for a weather radar may be provided by a pair of couplers 60, 64 mounted on a rigid web which connects to the R-T-P chassis 10 and provides coaxial connections between the couplers 60, 64 and power modules 62. The supporting structure for a large number of power modules would be more complex and preferably permit matrix stacking with, e.g. eight columns of four rows of modules. This permits the location of the module to be initially addressed using row and column lines similar to that used in many random access memories. A register in the module stores an identifying address from a data bus when the module is enabled, so that subsequently the module can be addressed via a bus and any module can be plugged into a location on the support structure.

Figure 4:
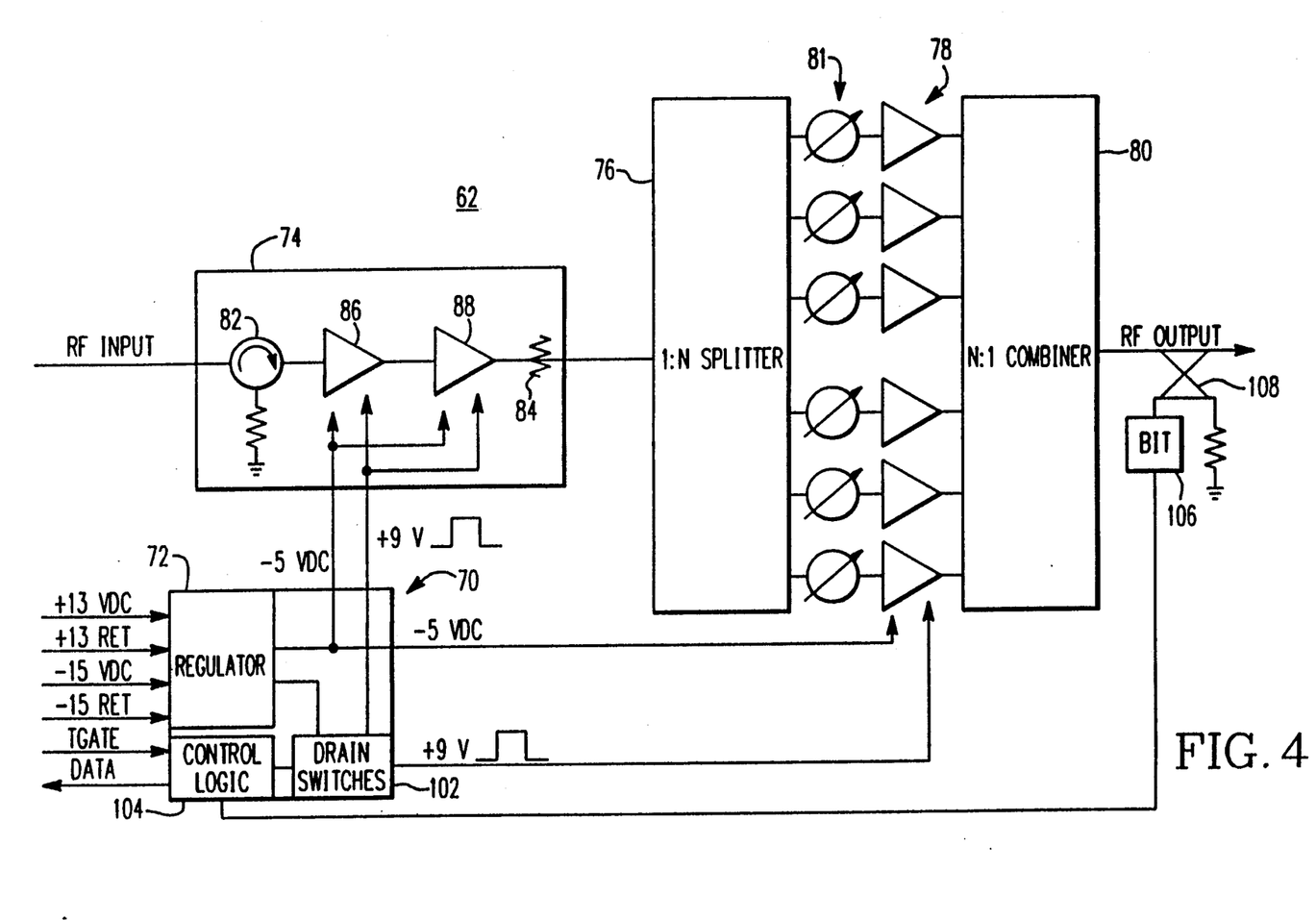
FIG. 4 is a block diagram of a power module in a transmitter according to the present invention.

A power module block diagram is provided in FIG. 4. Each power module is controlled by a power control unit 70 which may include a regulator 72 to regulate the power obtained from the power supply 20 and to output regulated power to the other components of the power module 62. The regulator 72 may provide primarily voltage conversion, or may perform a second level of power conditioning, e.g., to remove ripple. When graceful degradation is desirable, a switching power supply is preferably included in each power module, so that a failure of a single power supply affects only one module 62. When a large number of power modules 62 are included in a radar system, the switching power supply in regulators 72 are preferably constructed with a variable switching frequency centered around a common frequency, such as 500 KHz. The frequency used by the regulator is selected by data received from the system control unit 22.

The radio frequency signal distributed from the STALO 24 by the module splitter 60 is received by an input unit 74 which provides isolation between the power module 62 and the STALO 24. A power splitter 76 distributes the signal output by the input unit 74 to a plurality of power amplifiers 78 which produce amplified signals. The amplified signals from the power amplifiers 78 are combined to produce a module output signal by a power combiner 80.

To maximize the module output signal produced by the power combiner 80, phase shifters 81, are connected in series, each with a corresponding power amplifier 78, between the power splitter 76 and power combiner 80. Similarly the signals combined by the module combiner 64 should be aligned in phase to provide maximum power. The phase shifters may be microstrips which are tuned to supply phase aligned signals to the power amplifiers or to align the amplified signals output by the power amplifier 78 prior to being combined by the combiner 80. Alternatively, a monolithic microwave integrated circuit may be connected before or after the power amplifiers 78 to produce phase aligned signals. If MMICs are used as phase shifters, the power control unit 70 preferably outputs control signals to the MMIC phase shifters to properly align the phase of the signals combined by the power combiner 80.

The power amplifiers 78 and 88 may be model SPM90-3410 from AVANTEK of Santa Clara, Calif. These power amplifiers operate in the frequency range of 8.5 to 10.5 GHz and have a gain of 20 dB. Each has a maximum output of 10 watts, thus eight power amplifiers 78 will produce a module output signal with 75 watts (due to loss in the combiner 80) and 10 power amplifiers 78 will produce a module output signal of over 90 or near 100 watts.

The input unit 74 has isolators 82, 84 at each end. The isolator 82 which receives the radio frequency signal distributed by the module splitter 60 may be a S9A9101 isolator from TRAK Microwave of Tampa, Fla. Isolation at the output of the input unit 74 is preferably provided by a broadband pad, such as a model TS0500W1 from EMC of Cherry Hill, N.J. or a similar broadband pad of custom design. Between the two isolators 82, 84 are amplifiers connected in series to boost the radio frequency signal prior to power amplification by the parallel connected power amplifiers 78. A gain block 86 provides initial amplification of e.g., 15 dB. A weather radar for detecting windshear may operate in the X band and thus an X band gain block, such as a Texas Instruments TGA8024, may be used. A power amplifier 88 is preferably connected in series with the gain block 86. The power amplifier 88 may be constructed in the same manner as the power amplifiers 78 which is described below in detail.

Figure 5:
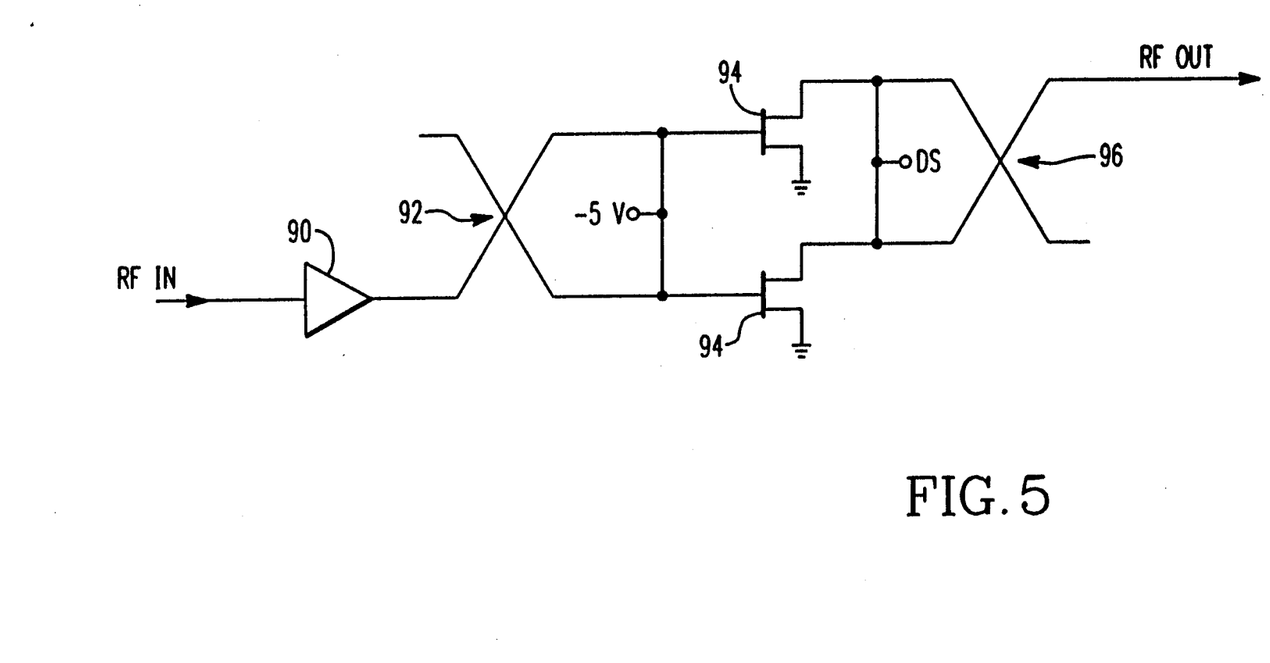
FIG. 5 is a block diagram of a power amplifier in a power module.

The construction of the SPM90-3410 power amplifier is illustrated in FIG. 5. The radio frequency signal distributed by the power splitter 76 is boosted by an MMIC driver 90 which may be similar to the gain block 86. A quadrature coupler 92 is used as a 1:2 splitter to equally divide the output from the MMIC driver 90 to two GaAs FETs 94. The FETs 94 may be 12 mm discrete devices to provide the power specifications noted above. One of the FETs 94 is connected to one output arm of the quadrature coupler 92 and the other FET 94 is connected to the other output arm. The drains of the FETs are connected to the input arms of a quadrature coupler 96. The quadrature coupler 96 has an output arm producing the amplified signal from the power amplifier 78.

As illustrated in FIG. 5, the gates of the FETs 94 receive $-5$ V and the drains of the FETs receive a switched $+9$ V represented by drain signal DS. As illustrated in FIG. 4, the power control unit 70 includes drain switches 102 which switchably connect the drains of the power amplifiers 78 to the regulator 72. Control logic 104 controls the switching of the drain switches 102 in response to power sequencing signals (TGATE) from the system control unit 22. Together, the control logic circuit 104 and drain switches 102 form a modulator which controls the operation of the power amplifiers 78, gain block 86 and power amplifier 88 in the input unit 74.

Figure 6:
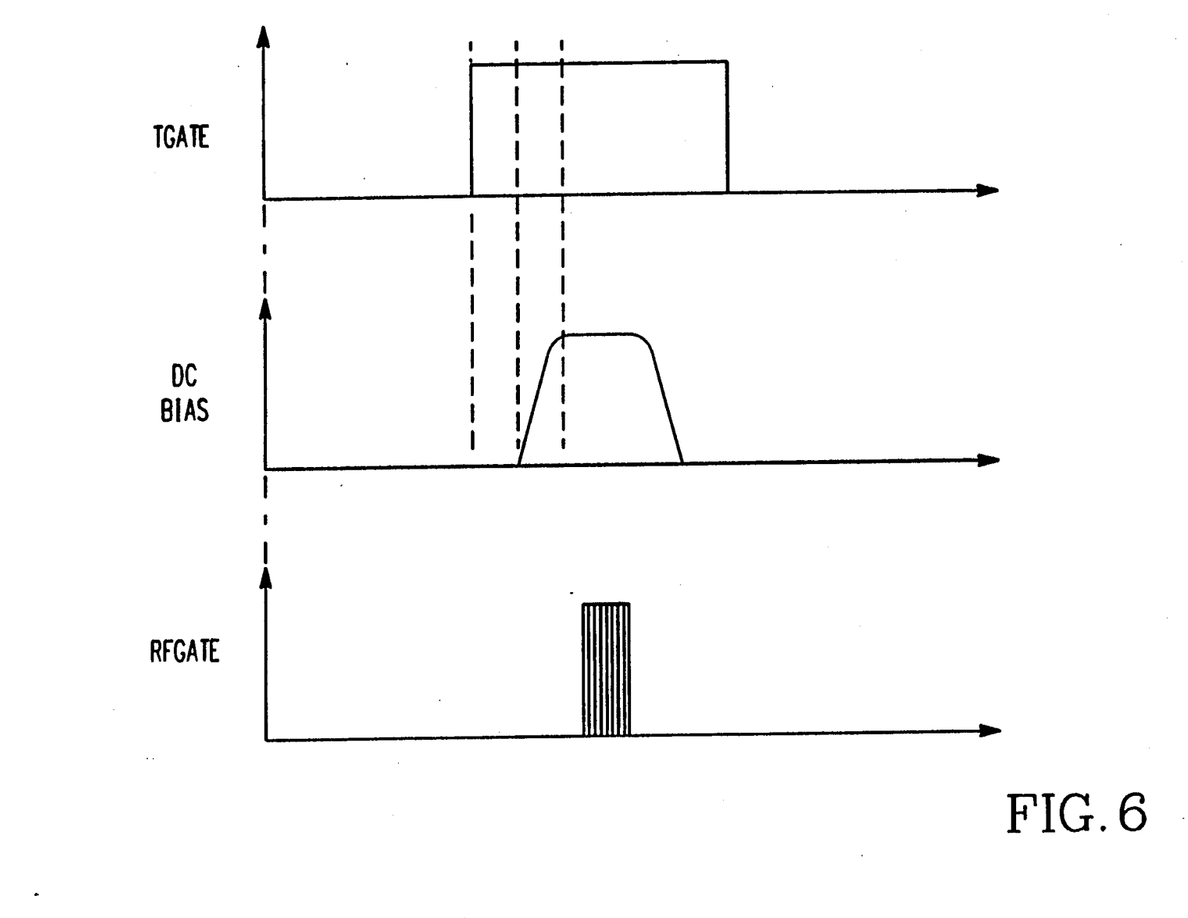
FIG. 6 is a timing diagram of signals received by a transistor in a power amplifier.

As illustrated in FIG. 6, the TGATE signal initiates switching in the drain switches 102 to produce a direct current bias across the FETs 94 in a power amplifier. Thus, when an RFGATE pulse of radio frequency energy is received from the power splitter 76, the FETs 94 are ready to amplify the pulse. In the preferred embodiment, the control logic circuit 104 is designed to respond to codes in the power sequencing signals from the system control unit 22 to individually control the power amplifiers 78. This can be accomplished by many types of logic circuits, including a field programmable gate array having, e.g., 1200 gates, such as an ACT101 from ACTEL of Sunnyvale, Calif. If sufficient speed can be obtained, bit slice processors or a programmable read only memory could be used for some functions of the control logic circuit 104.

Figure 7:
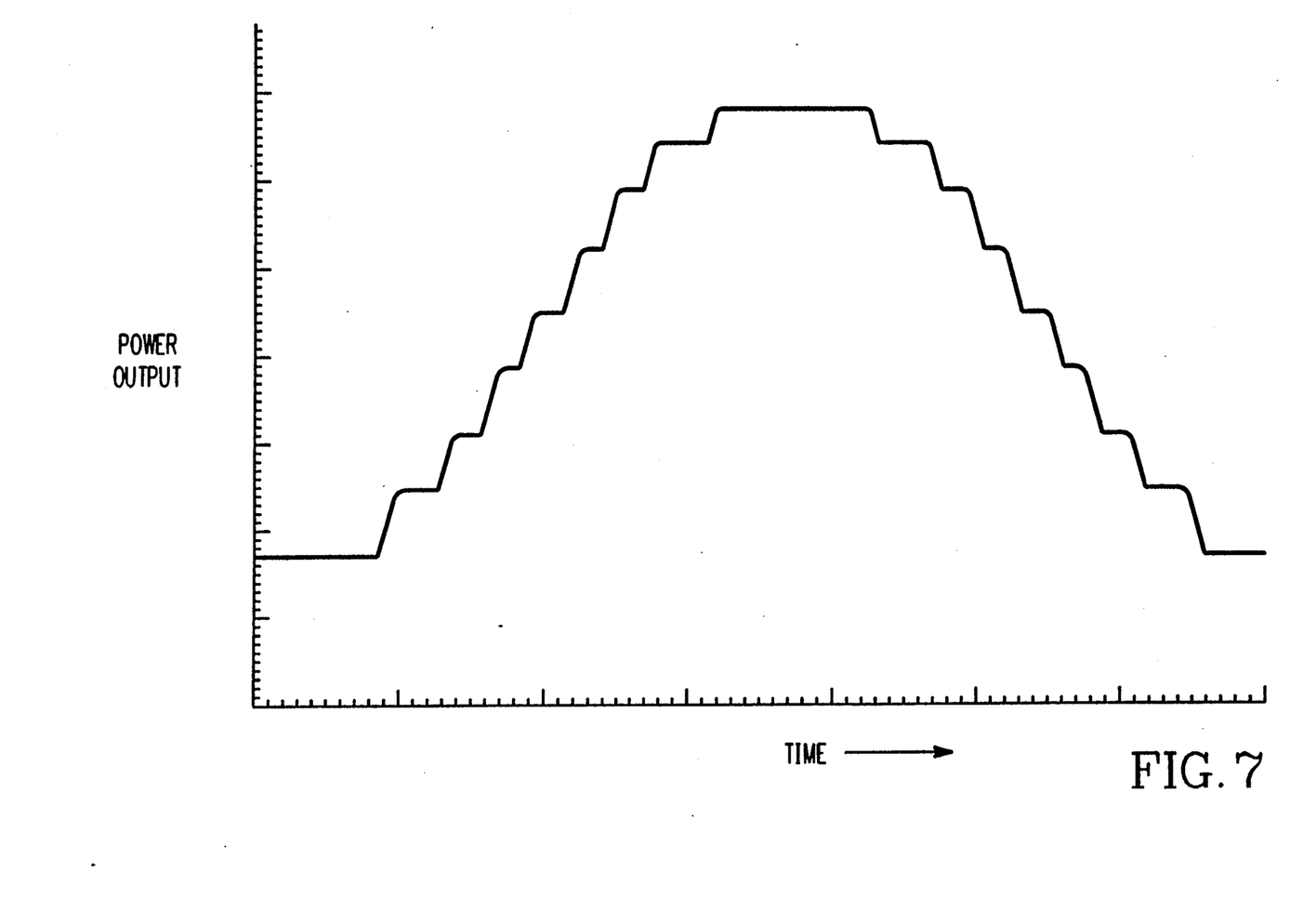
FIG. 7 is a graphical representation of one type of waveform which may be produced in a power mode.

In the preferred embodiment, there are three power generation modes. The first uses a single TGATE signal for a selected group of the power amplifiers 78 which may include all of the power amplifiers 78 and produces an amplified version of the RFGATE pulse illustrated in FIG. 6. The second mode produces a pulse of programmable shape, such as a pseudosinusoidal signal. One example of such a pulse is a Gaussian waveform on a pedestal approximately representing a Gaussian distribution. A similar waveform is $\cos^2$ which is illustrated in FIG. 7. In the second mode, the transmitter output signal is produced by providing a continuous wave radio frequency signal from the STALO 24 via the splitters 60, 76, then gradually increasing the number of power amplifiers 78 which are turned on and turning them off in the same sequence. An asymmetrical waveform or coded pulse may be produced using different timings to turn transistors on and off.

In one embodiment of the present invention, the synchronizer 42 supplies a 20 MHz clock which permits the power control unit 70 to operate the power amplifiers 78 with a quantization step of 25 nanoseconds by using alternate phases or edges of the clock signal. The power control unit 70 includes a memory (not shown separately) which is preferably a RAM to provide flexibility, but may be a ROM, to store the on and off timings of each of the power amplifiers in the power module 62. If a variety of waveform shapes are to be provided for selection by an operator, each shape may be downloaded to the memory and the operator will simply instruct the system control unit 22 which shape is to be programmed into the RAM. A counter (not shown separately) in the power control unit 70 is incremented by the clock from the synchronizer 42 to a programmed maximum value and logic gates compare the value in the counter with memory registers in the RAM to determine when the drain switches 102 should be energized to turn on corresponding power amplifiers 78. After a programmable period of time has passed since the last power amplifier 78 is turned on, the counter is decremented and comparisons are made to turn the power amplifiers off. If a symmetrical waveform is desired, the same registers can be used to turn the corresponding amplifiers on and off. For more flexibility, a second set of corresponding memory registers are used to determine when to turn off the power amplifiers 78 as the counter is decremented.

The third mode produces a sequence of power amplifier operation in which a small number of FETs 94, such as the FETs 94 within one of the power amplifiers 78, are turned on at a time, either within each power module 62 or throughout the system. Preferably, a built in test (BIT) unit 106 is connected to the output of the power combiner 80 via a coupler 108 to detect the power level of the module output signal; thus, permitting all power modules 62 to be tested simultaneously. A 30 dB directional coupler, such as model 6164-30 from ARRA in Bayshore, N.Y., may be used to provide this connection. The output of the BIT unit 106 may be supplied to the control logic circuit 104 to supply a BIT signal to the system control unit 22. If appropriate thresholds are provided in the BIT unit 106, a failure in one of the power amplifiers 78 can be detected and the phase shifters 81 can be tuned to provide phase aligned signals.

Using the present invention, many different patterns of amplifier operation can be obtained with simple modification to the control logic 104. The width, height and rise time of the radar pulse can be controlled, amplifier usage can be distributed across the power modules 62, etc., by supplying unique power sequencing signals to each power module 62. As a result, a basic power module 62 can be constructed for use in many different applications and only the control logic need be modified for a particular application. In addition, if it is learned that a pulse with a particular shape has benefits, or the power distribution needs to be modified, changes may be made to the control logic 104 or even adjusted during flight to select power sequencing signals provided by previously encoded logic. For example, a Gaussian waveform on a pedestal which is similar to the $\cos^2$ waveform illustrated in FIG. 7 produces radar pulses with low side lobes, thereby minimizing interference between parallel aircraft.

The many features and advantages of the present invention are apparent from the detailed specification, and thus it is intended by the appended claims to cover all such features and advantages of the system which fall within the true spirit and scope of the invention. Further, since numerous modifications and changes will readily occur to one skilled in the art from the disclosure of this invention, it is not decided to limit the invention to the exact construction and operation illustrated and described, accordingly, suitable modifications and equivalents may be resorted to, as falling within the scope and spirit of the invention.

What is claimed is:

1. A transmitter in a radar system also including a power supply unit connected to a signal processing unit and a stabilized local oscillator unit outputting a radio frequency signal, said transmitter comprising:
   a plurality of power modules, each power module including
      a power control unit, operatively connected to the power supply unit and the signal processing unit, to control operation of said power modules using control signals;
      a plurality of power amplifiers, operatively connected to said power control unit, each amplifying the radio frequency signal into an amplified signal in dependence upon the control signals;
      a power splitter, operatively connected to the stabilized local oscillator unit and said power amplifiers to distribute the radio frequency signal to said power amplifiers; and a power combiner, operatively connected to said power amplifiers, to combine the amplified signal from each of said power amplifiers to form a module output signal;

a module splitter, operatively connected to the stabilized local oscillator and said power modules to distribute the radio frequency signal to said power modules; and a module combiner, operatively connected to said power modules, to combine the module output signal from each of said power modules and produce a transmitter output signal.

2. A transmitter as recited in claim 1, wherein each of said power modules further comprises a plurality of phase shifters, each operatively connected in series with a corresponding power amplifier between said power splitter and said power combiner, to produce phase aligned signals.

3. A transmitter as recited in claim 2, wherein said phase shifters are microstrips, each connecting said power combiner to the corresponding power amplifier, to supply the phase aligned signals to said power amplifiers.

4. A transmitter as recited in claim 2, power control unit is further operatively connected to said phase shifters and outputs phase control signals thereto, and wherein said phase shifters are monolithic microwave integrated circuits, connected to said power control unit and each connecting said power combiner to the corresponding power amplifier, to output the phase aligned signals in dependence upon the phase control signals.

5. A transmitter as recited in claim 1, wherein the signal processing unit generates power sequencing signals for said controllers in each of said power modules, and wherein said power control unit comprises:

a regulator, operatively connected to the power supply unit, to regulate power obtained from the power supply unit and to output regulated power; and a modulator, operatively connected to the signal processing unit, said regulator and said power amplifiers, to supply the regulated power to said power amplifiers as the control signals, in dependence upon the power sequencing signals from the signal processing unit.

6. A transmitter as recited in claim 5, wherein said modulator comprises:

switches, operatively connected to said regulator and said power amplifiers, to switchably connect each of said power amplifiers to said regulator; and a control logic circuit, operatively connected to the signal processing unit, said regulator and said switches, to generate switch control signals controlling connection of said power amplifiers to said regulator by said switches in dependence upon the power sequencing signals from the signal processing unit.

7. A transmitter as recited in claim 6, wherein said control logic circuit in each of said power modules comprises means for producing the switch control signals to connect and disconnect said power modules to and from said regulator in a first sequence producing the transmitter output signal with a pseudosinusoidal shape in response to a first set of the power sequencing signals from the signal processing unit.

8. A transmitter as recited in claim 7, wherein said control logic circuit in each of said power modules further comprises means for producing the switch control signals to connect and disconnect said power modules to and from said regulators one at a time in a second sequence in response to a second set of the power sequencing signals from the signal processing unit.

9. A transmitter as recited in claim 6, wherein the stabilized local oscillator unit comprises means for periodically outputting a pulse of radio frequency energy as the radio frequency signal, and wherein said control logic circuit in each of said power modules comprises means for producing the switch control signals prior to the pulse of radio frequency energy, thereby turning on said power amplifiers prior to distribution of the radio frequency signal by said power splitter in each of said power modules.

10. A transmitter as recited in claim 5, wherein said power amplifiers comprise at least one field effect transistor operatively connected to said modulator, said power splitter and said power combiner.

11. A transmitter as recited in claim 10, wherein each of said power amplifiers comprises:

an integrated circuit driver, operatively connected to said power splitter;

a first quadrature coupler having an input arm operatively connected to said integrated circuit driver and having first and second output arms;

a first field effect transistor having a gate operatively connected to the first output arm of said first quadrature coupler and having a drain;

a second field effect transistor having a gate operatively connected to the second output arm of said first quadrature coupler and having a drain; and a second quadrature coupler having first and second input arms operatively connected to said first and second field effect transistors, respectively, and an output arm operatively connected to said power combiner, and wherein said modulator comprises:

drain switches, each operatively connected to said regulator and the drain of one of said first and second field effect transistors; and a control logic circuit, operatively connected to the signal processing unit, said regulator and said drain switches to generate switch control signals controlling connection of said regulator to the drains of said first and second field effect transistors, in dependence upon the power sequencing signals from the signal processing unit.

12. A transmitter as recited in claim 11, wherein said control logic circuit comprises means for generating the switch control signals to create a direct current bias across said first and second field effect transistors independently in each of said power modules, in dependence upon the power sequencing signals from the signal processing unit.

13. A transmitter as recited in claim 12, wherein the signal processing unit comprises means for producing first and second of the power sequencing signals, and wherein said control logic circuit comprises means for generating the switch control signals to produce the transmitter output signal with a substantially rectangular shape using a specified number of said power modules in response to the first set of the power sequencing signals and means for producing the transmitter output signal using one of said power modules at a time in response to the second set of the power sequencing signals.

14. A transmitter as recited in claim 13, wherein the signal processing unit further comprises means for producing a third set of the power sequencing signals, and
wherein said control logic circuit comprises means for generating the switch control signals to produce the transmitter output signal with a pseudosinusoidal shape in response to the third set of the power sequencing signals.

15. A transmitter as recited in claim 14, wherein said control logic circuit further comprises means for generating the switch control signals to produce a transmitter signal with a pseudosinusoidal shape approximately representing a central portion of a Gaussian distribution on a pedestal.

16. A transmitter as recited in claim 1, wherein each of said power modules further comprises an input unit, operatively connected to said module splitter, said power control unit and said power splitter to provide isolation between the stabilized local oscillator unit and said power amplifiers.

17. A transmitter as recited in claim 16, wherein said input unit comprises:
an isolator, coupled to ground, operatively connected to the stabilized local oscillator unit via said module splitter;
a gain block operatively connected to said isolator and said power control unit;
an input power amplifier operatively connected to said gain block and said power control unit; and
a broadband pad operatively connected to said input power amplifier and said power splitter.

18. A radar system, comprising:
system control means for controlling operation of said airborne radar system;
radio frequency means for producing an X band radio frequency signal;
a plurality of power modules, each having a plurality of transistors connected in parallel, for amplifying the radio frequency signal to produce amplified signals;
parallel connection means for connecting said power modules in parallel to produce a transmitter output signal;
amplifier control means for individually controlling said transistors; and
receiver means for receiving a return signal and supplying the return signal to said system control means for processing.

19. A radar system as recited in claim 18,
wherein said system control means generates regulator frequency signals indicating a different frequency of operation for each of said power modules, and
wherein said power modules each further include a switching power supply operatively connected to said transistors for regulating power supplied to said transistors using the frequency indicated by the regulator frequency signals produced by said system control means.

20. A radar system as recited in claim 18,
wherein said system control means further generates first and second sets of power sequencing signals supplied to said amplifier control means; and
wherein said amplifier control means comprises means for turning on said transistors in a first sequence producing the transmitter output signal with a Gaussian-shaped waveform in response to the first set of power sequencing signals and for turning on said transistors in a second sequence producing the transmitter output signals using a predefined number of said transistors at a time, in response to the second set of power sequencing signals.

21. A radar system as recited in claim 18, further comprising phase alignment means for phase aligning the amplified signals from said power modules prior to combining by said parallel connection means to produce the transmitter output signal.

22. A method of operating a radar system, comprising the steps of:
(a) producing a radio frequency signal;
(b) amplifying the radio frequency signal in a plurality of parallel connected transistors to produce amplified signals;
(c) individually controlling the parallel connected transistors to select a number of transistors to generate a radar pulse and to determine of when the transistors in the number of transistors selected generate the amplified signals;
(d) combining the amplified signals to produce a transmitter output signal;
(e) receiving an echo signal produced by the transmitter output signal; and
(f) processing the echo signal received in step (e).

23. A method as recited in claim 22, wherein said individual controlling in step (c) comprises the steps of:
(c1) generating control signals in a first mode to produce the transmitter output signal with a rectangular waveform where the number of transistors used is selectable;
(c2) generating the control signals in a second mode to produce the transmitter output signal with an approximately Gaussian-shaped waveform by gradually turning on and off the number of transistors used; and
(c3) generating the control signals in a test mode to produce an output waveform using only a minimum number of the transistors at a time.

* * * * *